(12) United States Patent
Tanaka et al.

(10) Patent No.: US 6,184,561 B1
(45) Date of Patent: Feb. 6, 2001

(54) SEMICONDUCTOR PRESSURE SENSOR HAVING STRAIN GAUGES AND STRESS BALANCE FILM

(75) Inventors: Hiroaki Tanaka, Kariya; Inao Toyoda; Yasutoshi Suzuki, both of Okazaki, all of (JP)

(73) Assignee: Denso Corporation, Kariya (JP)

( * ) Notice: Under 35 U.S.C. 154(b), the term of this patent shall be extended for 0 days.

(21) Appl. No.: 09/322,033

(22) Filed: May 28, 1999

(30) Foreign Application Priority Data

May 29, 1998 (JP) .................................................. 10-149908

(51) Int. Cl.[7] .................................................... H01L 29/82
(52) U.S. Cl. .............................................................. 257/417
(58) Field of Search ................................. 257/414, 417, 257/419, 420, 418, 415, 925

(56) References Cited

U.S. PATENT DOCUMENTS

| | | |
|---|---|---|
| 5,289,721 | 3/1994 | Tanizawa et al. . |
| 5,600,074 * | 2/1997 | Marek et al. . |
| 5,844,287 * | 12/1998 | Hassan et al. . |
| 5,880,509 * | 3/1999 | Watanabe et al. . |
| 5,889,311 * | 3/1999 | Shinogi et al. . |
| 5,986,316 * | 11/1999 | Toyoda et al. . |
| 6,011,273 * | 1/2000 | Ichikawa et al. . |

FOREIGN PATENT DOCUMENTS

| | | |
|---|---|---|
| 6-112506 * | 4/1994 | (JP) . |
| 6-163939 * | 6/1994 | (JP) . |
| 2650455 | 5/1997 | (JP) . |
| 10-170367 | 6/1998 | (JP) . |

* cited by examiner

*Primary Examiner*—Sheila V. Clark
(74) *Attorney, Agent, or Firm*—Pillsbury Madison & Sutro LLP

(57) ABSTRACT

In a semiconductor pressure sensor having a diaphragm portion and strain gauges on the diaphragm portion, Al stress balance films are provided around the diaphragm portion to balance changes in stress of the strain gauges, which are produced by a change in temperature. As a result, sensor output is prevented from varying due to the change in temperature.

14 Claims, 6 Drawing Sheets

SEMICONDUCTOR PRESSURE SENSOR HAVING STRAIN GAUGES AND STRESS BALANCE FILM

CROSS REFERENCE TO RELATED APPLICATION

This application is based upon and claims the benefit of Japanese Patent Application No. 10-149908, filed on May 29, 1998, the contents of which are incorporated herein by reference.

BACKGROUND OF THE INVENTION

1. Field of the Invention

This invention relates to a semiconductor pressure sensor having strain gauges provided on a diaphragm portion for detecting pressure applied thereto.

2. Description of the Related Art

A conventional semiconductor pressure sensor includes a sensor chip 10 shown in FIG. 1 having a thin diaphragm portion 10a indicated by a dotted line in the figure. The diaphragm portion 10a has four piezo-resistance members (strain gauges) 1a to 1d made of an impurity diffusion layer thereon, two of which are center gauges 1a, 1b arranged at the central portion thereof and the other two of which are side gauges 1c, 1d arranged at the periphery thereof. The gauges 1a to 1d are electrically connected to form a bridge circuit as shown in FIG. 2 so that an electrical signal is output from terminals $O_A$, $O_B$ in accordance with pressure. To form this constitution, an aluminum (Al) wiring member is provided around the diaphragm portion 10a to be electrically connected to the strain gauges 1a to 1d, and the sensor output is taken out from a circuit portion not shown to which the wiring member 2 is connected.

As shown in FIG. 3, the sensor chip 10 is fixed to a glass base 11 by anode-bonding, and the glass base 11 is adhered to an inside wall of a casing 13 made of polybutylene terephthalate (PBT) or the like by silicone system adhesive 12. Silicone gel 14 is coated on the surface of the sensor chip 10. In this constitution, the casing 13 can produce thermal distortion that adversely and innegligibly affects the sensor chip 10. Therefore, as shown in FIG. 3, a plate 15 made of 42 alloy is adhered to the lower surface of the glass base 11 by silicone system adhesive 16 to reduce the adverse effect of the thermal distortion of the casing 13 to the sensor chip 10. However, it is found that the sensor output still varies as a result of thermal hysteresis.

SUMMARY OF THE INVENTION

The present invention has been made in view of the problem described above. An object of the present invention is to reduce variations of an output value from a semiconductor pressure sensor, caused by thermal hysteresis.

According to a first aspect of the present invention, a semiconductor pressure sensor has a stress balance film for balancing changes in stress of a plurality of resistive members, produced by a change in temperature. This is based on an analysis that variation in sensor output is caused by different changes in stress of the resistive members, which are produced by the change in temperature. According to the present invention described above, the variation of the sensor output can be reduced to approximately zero by the stress balance film for balancing the changes in stress of the resistive members.

The stress balance film may be integrally formed with a wiring member that is electrically connected to the resistive members and provided around a diaphragm portion on which the resistive members are disposed. The stress balance film may include a plurality of stress balance film portions disposed around the diaphragm portion.

According to a second aspect of the present invention, a semiconductor pressure sensor includes a wiring member electrically connected to a plurality of resistive members, and made of a material that exhibits a yield phenomenon at a temperature higher than an operational temperature range of the pressure sensor. This is based on an analysis that the changes in stress of the resistive members are produced by thermal hysteresis characteristics of the wiring member arranged around the resistive members.

When the wiring member is made of the material described above, the wiring member does not exhibit thermal hysteresis characteristics within the operational temperature range of the pressure sensor. As a result, the variation of the sensor output can be prevented.

BRIEF DESCRIPTION OF THE DRAWINGS

Other objects and features of the present invention will become more readily apparent from a better understanding of the preferred embodiment described below with reference to the following drawings.

DETAILED DESCRIPTION OF THE PREFERRED EMBODIMENT

Figure 1:
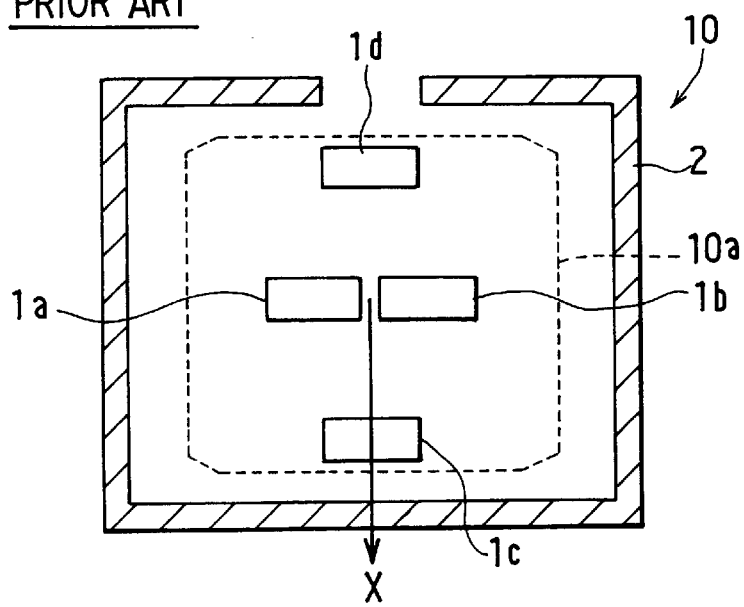
FIG. 1 is a plan view showing a semiconductor pressure sensor according to a prior art.
Figure 2:
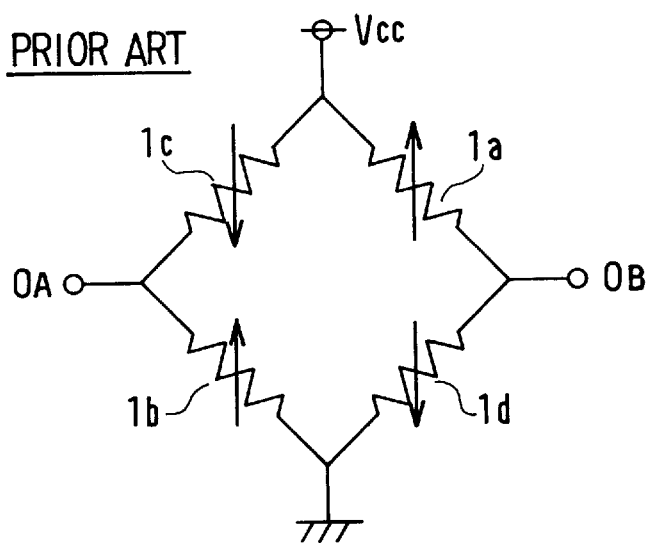
FIG. 2 is a diagram showing a bridge circuit constitution composed of strain gauges.
Figure 3:
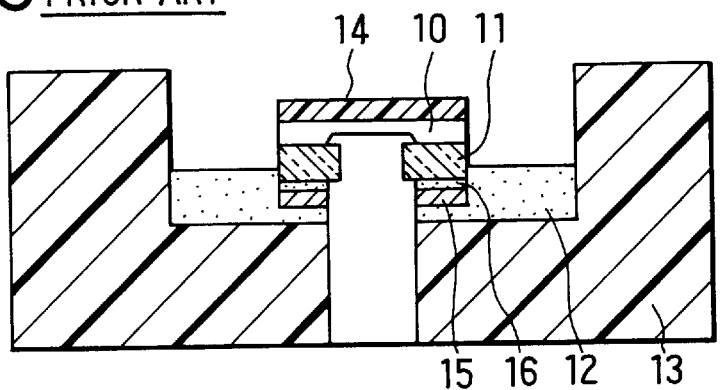
FIG. 3 is cross-sectional view showing a state where the pressure sensor of FIG. 1 is fixed to a casing.
Figure 4:
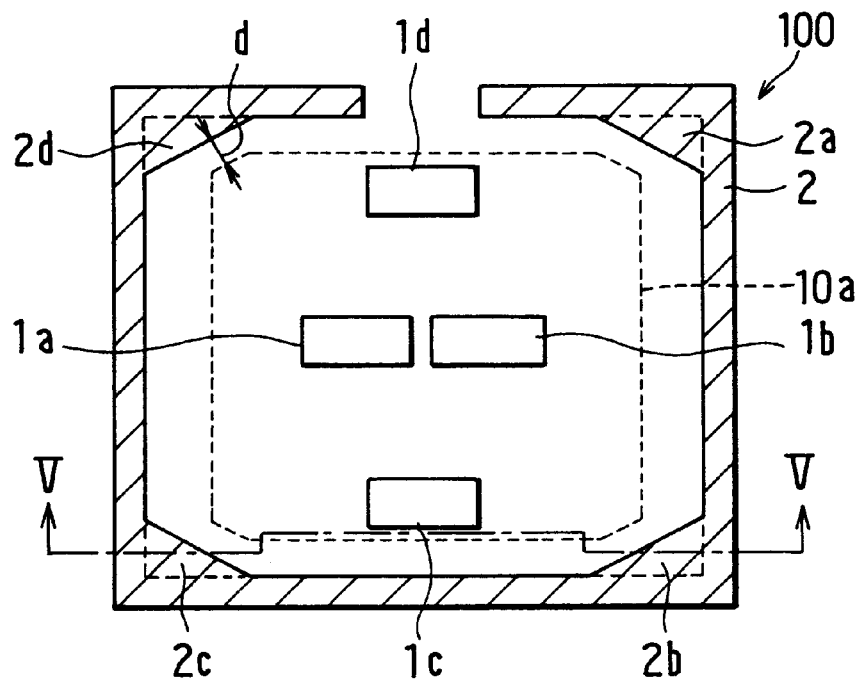
FIG. 4 is a plan view showing a semiconductor pressure sensor in a preferred embodiment according to the present invention.
Figure 5:
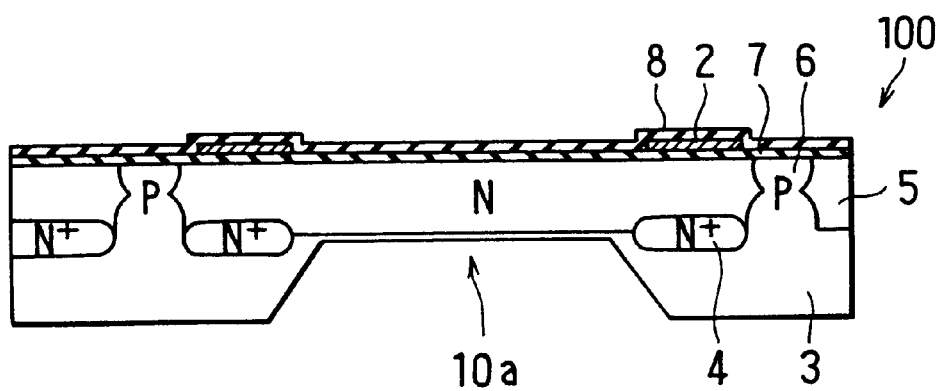
FIG. 5 is a cross-sectional view taken along a V—V line in FIG. 4.

Herebelow, a semiconductor pressure sensor in a preferred embodiment of the present invention will be explained referring to FIGS. 4 and 5, in which the same parts as those in FIGS. 1 to 3 are indicated by the same reference numerals.

Referring to FIG. 1, in a sensor chip 100, an N type buried layer 4 is provided in a P type silicon substrate 3 having a (110) crystal orientation, and an N type epitaxial layer 5 is provided thereon. A part of the P type silicon substrate 3 is removed by etching to form a thin diaphragm portion 10a. Center gauges 1a, 1b and side gauges 1c, 1d are formed in the diaphragm portion 10a by impurity diffusion. The gauges 1a to 1d forms a bridge circuit as shown in FIG. 2 as well. A P type isolation region 6 is formed in the N type epitaxial layer 5 to electrically insulate the diaphragm portion 10a from the periphery thereof. An oxide film 7 is provided on the N type epitaxial layer 5, and an Al wiring member 2 is disposed on the oxide film 7 at the periphery of the diaphragm portion 10a. A protection film 8 made of oxide, nitride, or the like is disposed to cover the Al wiring member 2.

The center gauges 1a, 1b and the side gauges 1c, 1d are electrically connected to the wiring member 2 through contact holes formed in the oxide film 7, and the wiring member 2 is electrically connected to a circuit portion formed on the N type epitaxial layer 5 as described below. An output signal from the bridge circuit is processed in the circuit portion to be taken out as sensor output.

Figure 6:
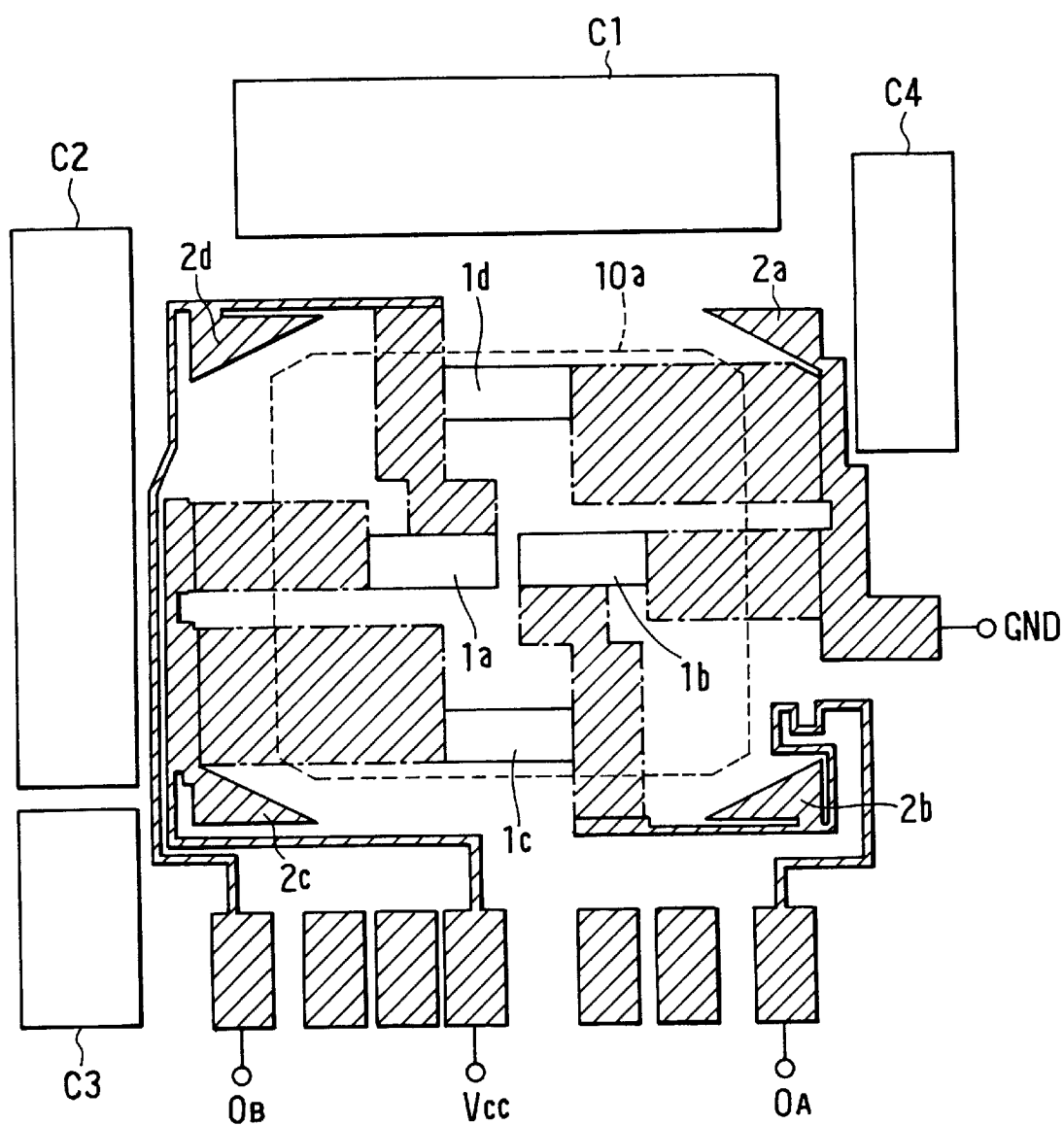
FIG. 6 is a plan view showing a detailed pattern of a wiring member shown in FIG. 5 and circuit portions.

Al film portions 2a to 2d as stress balance films are provided as parts of the wiring member 2 to face the four corners of the diaphragm portion 10a. A distance d of each of the Al film portions 2a to 2d from the edge of the diaphragm portion 10a is approximately 80 μm. The wiring member 2 is simplified in FIG. 4 for easily discriminating the Al film portions 2a to 2d therefrom; however, the wiring member 2 practically has a pattern shown in FIG. 6, and has a pattern disposed around the circuit portion including a constant current power supply part C1, a temperature detection bridge part C2, ESD elements C3, C4, and the like. The pattern of the wiring member 2 arranged around the circuit portion is omitted in FIG. 6.

According to this embodiment, the Al film portions 2a to 2d reduce the variation of the sensor output caused by thermal hysteresis. This effect was experimentally confirmed using three pressure sensor samples A, B, and C . Sample A has the same constitution as that of the conventional pressure sensor shown in FIGS. 1 and 3. Sample B has the same constitution as that of the present embodiment shown in FIGS. 4 and 5. Sample C has a constitution shown in FIG. 7. In a sensor chip 10a of sample C, the Al thin film portions 2a to 2d are disposed to overlap with the corners of the diaphragm portion 10a.

Figure 8:
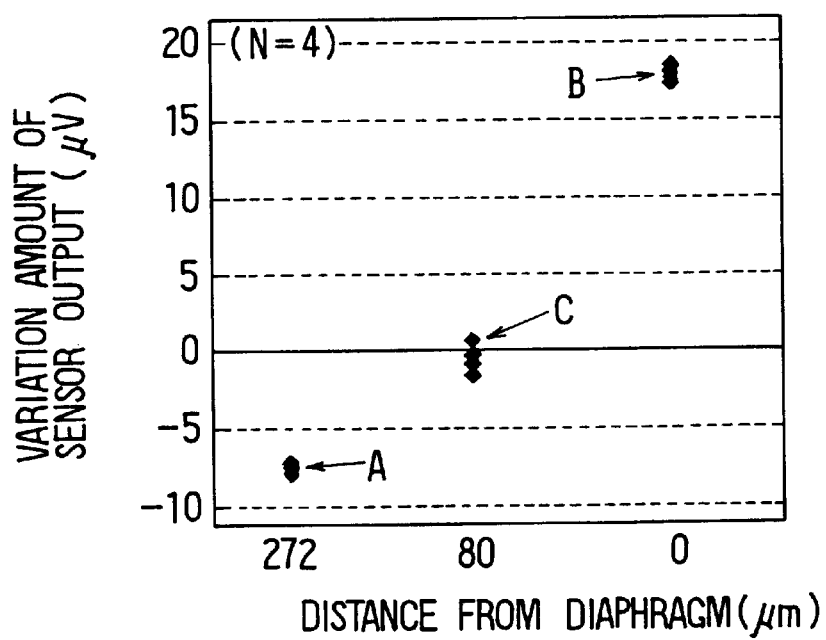
FIG. 8 is a graph showing a relationship between a distance of the wiring member from a diaphragm and a variation amount of sensor output produced by a thermal test.

Then, variations of sensor outputs from samples A to C caused by thermal hysteresis were measured by a thermal test. In the thermal test, an output value from each sensor when ambient temperature was initially kept at a room temperature (approximately 25° C.) and an output value from the sensor when the temperature was returned to the room temperature after raising the temperature up to 70° C. were measured, and a difference between the two output values was calculated. The result are shown in FIG. 8. A horizontal axis of FIG. 8 represents a distance of the wiring member 2 including the Al film portions 2a to 2d from the corners of the diaphragm portion 10a.

Figure 7:
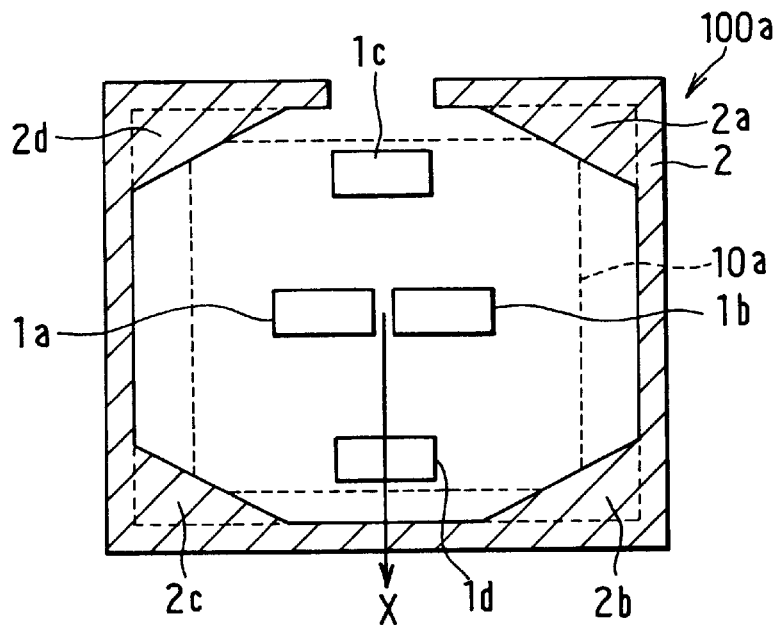
FIG. 7 is a plan view showing a semiconductor pressure sensor as a comparative example in the embodiment.

As shown in FIG. 8, the output value of sample A corresponding to the conventional pressure sensor changed to a minus side by the thermal test described above, and the output value of sample B shown in FIG. 7 changed to a plus side. The output value of sample C corresponding to the present embodiment hardly changed by the test. Accordingly, it is confirmed that the Al film portions 2a to 2d can effectively prevent the variation of the sensor output produced by the thermal test.

Figure 9A:
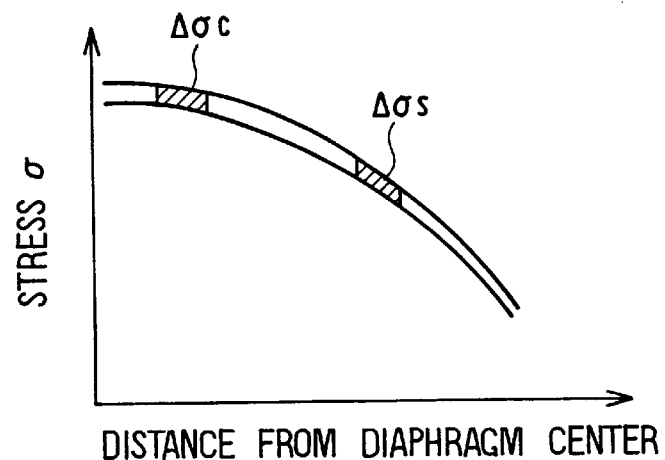
FIGS. 9A and 9B are graphs for explaining two cases where Al film portions (stress balance films) are not formed, and are formed, respectively.

More specifically, when the Al film portions 2a to 2d are not formed as shown in FIG. 1 (sample A), stress σ in direction X in FIG. 1 changes by the thermal test described above as shown in FIG. 9A, in which the upper curve indicates stress σ when the temperature is kept at the room temperature and the lower curve indicates stress σ when the temperature is returned to the room temperature after being raised to 70° C. In this case, a difference in stress $\Delta\sigma c$ at the center gauges 1a, 1b and a difference in stress $\Delta\sigma s$ at the side gauges 1c, 1d satisfy a relationship of $\Delta\sigma c - \Delta\sigma s < 0$.

Figure 9B:
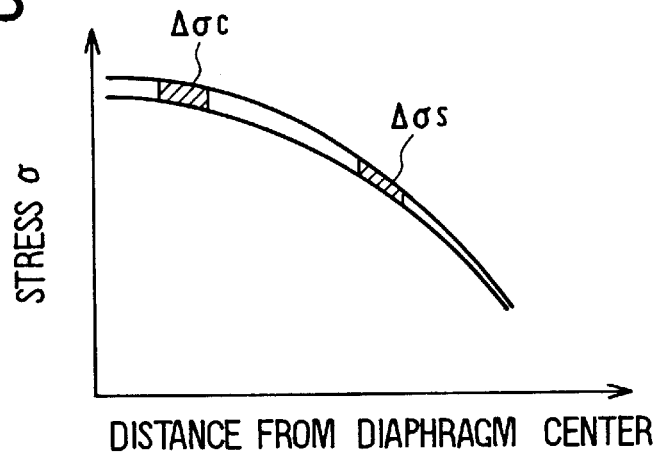

On the other hand, when the Al film portions 2a to 2d are formed at the four corners of the diaphragm portion 10a as shown in FIG. 7 (sample B), stress σ in direction X in FIG. 7 changes by the thermal test as shown in FIG. 9B, in which the upper curve indicates stress σ when the temperature is kept at the room temperature and the lower curve indicates stress σ when the temperature is returned to the room temperature after being raised to 70° C. as well. In this case, the relationship between the difference in stress $\Delta\sigma c$ at the center gauges 1a, 1b and the difference in stress $\Delta\sigma s$ at the side gauges 1c, 1d changes into $\Delta\sigma c - \Delta\sigma s > 0$. Therefore, the sensor output from sample A not having the Al film portions 2a to 2d is shifted to a plus side, while the sensor output from sample B having the Al film portions 2a to 2d are shifted to a minus side.

This phenomenon is considered as follows in connection with the hysteresis property of the Al wiring member and the Al film portions.

Al forming the wiring member 2 has an extremely small yield stress of approximately 15 MPa. Therefore, stress produced in the wiring member 2 due to a change in temperature easily exceeds the yield stress thereof, at which a yield phenomenon occurs to produce residual strain and residual stress in the wiring member 2. The residual strain and the residual stress remain even after the temperature is returned to the room temperature. This hysteresis property differently affects the center gauges 1a, 1b and the side gauges 1c, 1d, thereby producing different changes in stress of the center gauges 1a, 1b, and the side gauges 1c, 1d. The variation of the sensor output comes from this different changes in stress of the center and side gauges 1a to 1d, i.e., from the unbalance of thermal hysteresis effect between the center gauges 1a, 2b and the side gauges 1c, 1d. It is presumed that the Al film portions 2a to 2d can compensate the unbalance of the thermal hysteresis effect between the center gauges 1a, 1b and the side gauges 1c, 1d to balance the changes in stress of the center and side gauges 1ato 1d.

Figure 10:
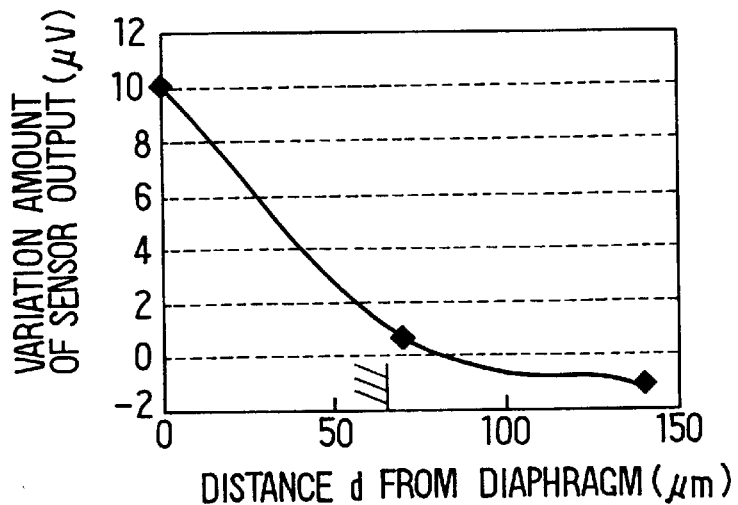
FIG. 10 is a graph showing a relationship between a distance of the Al film portions from the diaphragm and a variation amount of sensor output produced by a thermal test.

Based on this analysis, the positions of the Al film portions 2a to 2d are optimized around the corners of the diaphragm portion 10a. Specifically, a change in variation amount (thermal hysteresis amount) of the sensor output with respect to the distance d (see FIG. 4) of each Al film portion from each corner of the diaphragm portion 10a (diaphragm edge) was measured by the thermal test substantially in the same manner as described above. The result is shown in FIG. 10. As understood from FIG. 10, the variation amount of the sensor output is decreased as the distance d is increased. When the distance is approximately 80 μm, the variation amount of the sensor output is approximately zero. Accordingly, the distance d of the Al film portions 2a to 2d from the diaphragm portion 10a was determined, and applied to the pressure sensor (sample C) of the present embodiment. The variation amount of the sensor output from sample C is indicated in FIG. 8 in comparison with samples A, B as well as in FIG. 10.

Thus, according to this embodiment, the different changes in stress among the strain gauges 1a to 1d, i.e., the unbalance of the thermal hysteresis effect by the wiring member 2 to the strain gauges 1a to 1d are adjusted by the Al film portions 2a to 2d functioning as the stress balance films to reduce the variation amount of the sensor output. Incidentally, the results shown in FIGS. 8, 9, and 10 were obtained by the thermal test in which the temperature was returned to the room temperature from a high temperature (70° C.); however, it is confirmed that the same effect of making the variation amount of the sensor output to approximately zero is obtained by a thermal test in which the temperature is decreased to a low temperature (−30° C.), and then returned to the room temperature.

Figure 11A:
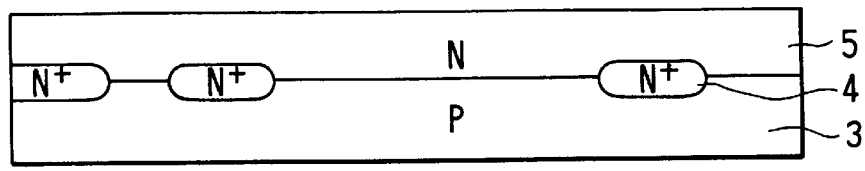
FIGS. 11A to 11F are a process for manufacturing the pressure sensor shown in FIGS. 4 and 5.
Figure 11B:
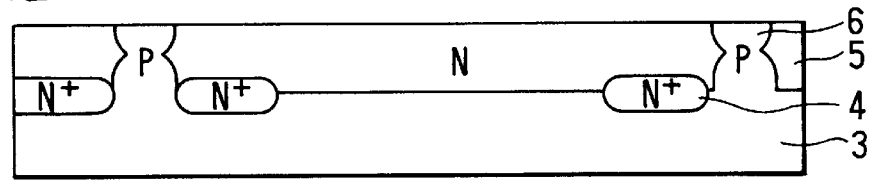
Figure 11C:
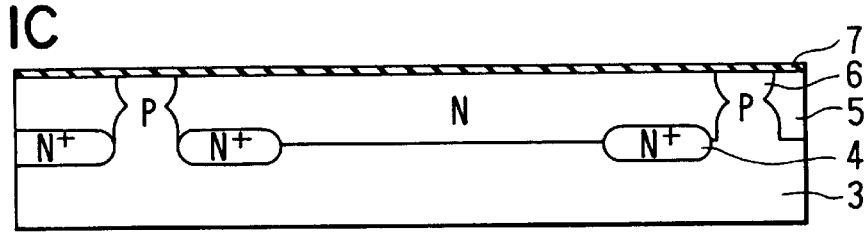

Next, a method of manufacturing the semiconductor pressure sensor in the present embodiment will be explained referring to FIGS. 11A to 11F. First, a semiconductor substrate is prepared. As shown in FIG. 11A, the semiconductor substrate is composed of the P type silicon substrate 3, the N type buried layer 4 formed in the P type silicon substrate 3, and the N type epitaxial layer 5 formed on the silicon substrate 3. Next, the P type isolation region 6 is formed in the N type epitaxial layer 5 as shown in FIG. 11B, and the oxide film 7 is formed on the N type epitaxial layer 5 as shown in FIG. 11C.

Figure 11D:
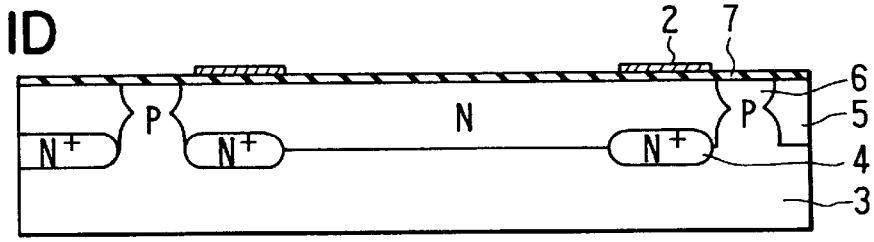
Figure 11E:
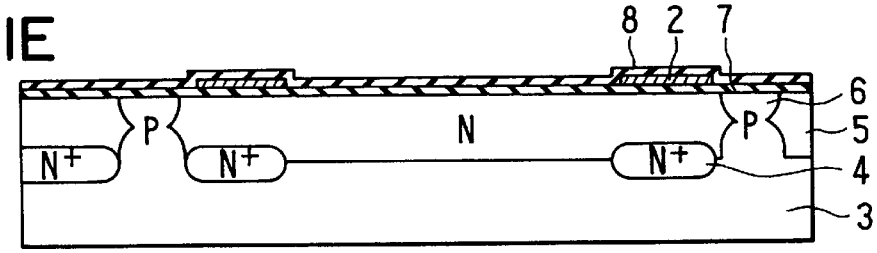
Figure 11F:
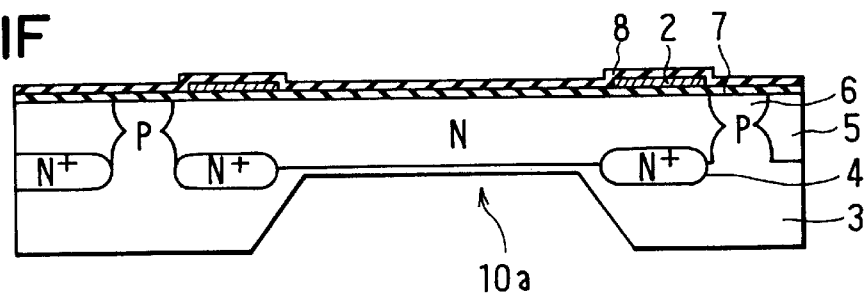

After that, the wiring member 2 and the stress balance films 2a to 2d are formed from Al as shown in FIG. 11D. After the protection film 8 is formed as shown in FIG. 11E, the P type silicon substrate 3 is etched from the back surface side, thereby forming the diaphragm portion 10a as shown in FIG. 11F. As a result, the semiconductor pressure sensor shown in FIGS. 4 and 5 is completed.

In the method described above, since the Al film portions 2a to 2d as the stress balance films are formed in the identical step with the wiring member 2, it is not necessary to perform a special step for the stress balance films. Although the stress balance films 2a to 2d are formed as parts of the wiring member 2 in this embodiment, the stress balance films 2a to 2d may be formed separately from the wiring member 2. Each shape of the stress balance films 2a to 2d is not limited to a triangle, and is changeable.

Further, when the stress balance films 2a to 2d are provided to face the four corners of the diaphragm portion 10a as in the present embodiment, a space between the wiring member 2 and the strain gauges 1a to 1d can be effectively utilized especially when the diaphragm is octagonal; however, the positions of the stress balance films 2a to 2d may be changed. For example, the stress balance films 2a to 2d may be formed more adjacently to the center gauges 1a, 1b. The stress balance films 2a to 2d may be made of other materials such as Al—Si, Ni, in addition to Al, provided that the material has a small yield stress.

The stress balance films 2a to 2d are provided to compensate the unbalance of the thermal hysteresis effect by the Al wiring member 2 among the strain gauges 1a to 1d, and the thermal hysteresis effects are peculiar to the wiring member 2 made of material having a small yield stress. Therefore, when the wiring member 2 is made of material having a yield stress that is larger than a maximum stress produced in the wiring member 2 at an operational temperature range of, for instance, −30° C. to 70° C., the variation of the sensor output can be effectively prevented without providing the stress balance films 2a to 2d. The applicable materials for such a wiring member are, for instance, Al(4.5 wt %)—Mg(0.5 wt %)—Mn, Al(4 wt %)—Cu(0.6wt %)—Mg(0.5 wt %)—Mn, Al(4.5 wt %)—Cu(1.5 wt %)—Mg(0.6 wt %)—Mn, and Al(5.6 wt %)—Zn(2.5 wt %)—Mg(1.6 wt %)—Cu, respectively having 195 MPa, 195 MPa, 323 MPa, 505 MPa in yield stress.

Although the present invention is applied to the pressure sensor composed of the silicon substrate 3 having a (110) crystal orientation, it may be applied to a pressure sensor composed of a silicon substrate having a (100) crystal orientation.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor pressure sensor comprising:

a sensor chip having a diaphragm portion for being displaced upon receiving a pressure thereon;

a plurality of resistive members provided on the diaphragm portion and respectively having changes in stress by a change in temperature; and a stress balance film provided on the sensor chip for balancing the changes in stress of the plurality of resistive members.

2. The semiconductor pressure sensor of claim 1, wherein the changes in stress of the plurality of resistive members are produced by the change in temperature in a range of 25° C. to 70° C., and are balanced by the stress balance film.

3. The semiconductor pressure sensor of claim 1, wherein the changes in stress of the plurality of resistive members are produced by the change in temperature in a range of −30° C. to 25° C., and are balanced by the stress balance film.

4. The semiconductor pressure sensor of claim 1, wherein the stress balance film balances the changes in stress of the plurality of resistive members by a residual strain thereof produced by the change in temperature.

5. The semiconductor pressure sensor of claim 1, wherein the stress balance film includes a plurality of stress balance film portions disposed at a periphery of the diaphragm portion.

6. The semiconductor pressure sensor of claim 1, further comprising a wiring member disposed at the periphery of the diaphragm portion and electrically connected to the plurality of resistive members, wherein the stress balance film is integrally formed with the wiring member.

7. The semiconductor pressure sensor of claim 6, wherein:

the wiring member has a hysteresis property in a temperature range of −30° C. to 70° C. to cause unbalance among the changes in stress of the plurality of resistive members; and the stress balance film is disposed at a specific position to adjust the unbalance.

8. The semiconductor pressure sensor of claim 7, wherein the wiring member and the stress balance film are made of aluminum.

9. A semiconductor pressure sensor comprising:

a sensor chip having a diaphragm portion for being displaced upon receiving a pressure thereon;

a plurality of resistive members provided on the diaphragm portion;

a wiring member disposed on the sensor chip to be electrically connected to the plurality of resistive members, and exhibiting a yield phenomenon within an operational temperature range of the pressure sensor, which causes an unbalance among changes in stress of the plurality of resistive members; and a stress balance film disposed on the sensor chip to adjust the unbalance among the changes in stress of the plurality of resistive members.

10. The semiconductor pressure sensor of claim 9, wherein the wiring member and the stress balance film are made of aluminum.

11. The semiconductor pressure sensor of claim 9, wherein:
   the diaphragm portion has a polygonal shape with a plurality of corners; and
   the stress balance film includes a plurality of stress balance film portions disposed around the diaphragm portion to face the plurality of corners.

12. The semiconductor pressure sensor of claim 9, wherein the operational temperature range is from −30° C. to 70° C.

13. A semiconductor pressure sensor comprising:
   a sensor chip having a diaphragm portion for being displaced upon receiving a pressure thereon;
   a plurality of resistive members provided on the diaphragm portion; and
   a wiring member disposed on the sensor chip and electrically connected to the plurality of resistive members, the wiring member being made of a material having a yield stress that is larger than a maximum stress produced therein at an operational temperature range of the pressure sensor.

14. The semiconductor pressure sensor of claim 13, wherein the material is an aluminum alloy.

* * * * *